United States Patent
Ptak et al.

(10) Patent No.: US 9,041,027 B2
(45) Date of Patent: May 26, 2015

(54) METHODS OF PRODUCING FREE-STANDING SEMICONDUCTORS USING SACRIFICIAL BUFFER LAYERS AND RECYCLABLE SUBSTRATES

(75) Inventors: Aaron Joseph Ptak, Littleton, CO (US); Yong Lin, Albuquerque, NM (US); Andrew Norman, Evergreen, CO (US); Kirstin Alberi, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 13/990,756

(22) PCT Filed: Dec. 1, 2010

(86) PCT No.: PCT/US2010/058514
§ 371 (c)(1),
(2), (4) Date: May 30, 2013

(87) PCT Pub. No.: WO2012/074523
PCT Pub. Date: Jun. 7, 2012

(65) Prior Publication Data
US 2013/0256751 A1    Oct. 3, 2013

(51) Int. Cl.
*H01L 33/26* (2010.01)
*H01L 21/02* (2006.01)
(Continued)

(52) U.S. Cl.
CPC ...... *H01L 21/0242* (2013.01); *H01L 21/02439* (2013.01); *H01L 21/02491* (2013.01);
(Continued)

(58) Field of Classification Search
CPC .................. H01L 33/12; H01L 33/16; H01L 2924/12041
USPC ......... 257/94, 103, 190, E33.048; 438/46, 47
See application file for complete search history.

(56) References Cited

U.S. PATENT DOCUMENTS

| | | |
|---|---|---|
| 4,136,207 A | 1/1979 | Bender |
| 5,164,359 A | 11/1992 | Calviello et al. |

(Continued)

FOREIGN PATENT DOCUMENTS

| | | |
|---|---|---|
| WO | 03084886 | 10/2003 |
| WO | 2004022820 | 3/2004 |

(Continued)

OTHER PUBLICATIONS

Kuznetsov, et al., "General Orientational Characteristics of Heteroexpitaxial Layers of AII and BVI Semiconductors on Sapphire and Semiconductor Substrates with Diamond and Sphalerite Structures (AIIBV)," Crystallography Reports, vol. 47, No. 3, Nov. 3, 2002, pp. 514-518.

(Continued)

*Primary Examiner* — Minh-Loan Tran
(74) *Attorney, Agent, or Firm* — John C. Stolpa; Michael A. McIntyre (57) ABSTRACT

A method of producing semiconductor materials and devices that incorporate the semiconductor materials are provided. In particular, a method is provided of producing a semiconductor material, such as a III-V semiconductor, on a spinel substrate using a sacrificial buffer layer, and devices such as photovoltaic cells that incorporate the semiconductor materials. The sacrificial buffer material and semiconductor materials may be deposited using lattice-matching epitaxy or coincident site lattice-matching epitaxy, resulting in a close degree of lattice matching between the substrate material and deposited material for a wide variety of material compositions. The sacrificial buffer layer may be dissolved using an epitaxial liftoff technique in order to separate the semiconductor device from the spinel substrate, and the spinel substrate may be reused in the subsequent fabrication of other semiconductor devices. The low-defect density semiconductor materials produced using this method result in the enhanced performance of the semiconductor devices that incorporate the semiconductor materials.

10 Claims, 9 Drawing Sheets

(51) Int. Cl.
*C30B 23/02* (2006.01)
*C30B 25/18* (2006.01)
*C30B 29/40* (2006.01)
*H01L 29/04* (2006.01)

(52) U.S. Cl.
CPC ...... *H01L21/02521* (2013.01); *H01L 21/0254* (2013.01); *H01L 21/02543* (2013.01); *H01L 21/02546* (2013.01); *H01L 21/0256* (2013.01); *H01L 21/02664* (2013.01); *C30B 23/025* (2013.01); *C30B 25/183* (2013.01); *C30B 29/40* (2013.01); *H01L 29/04* (2013.01)

(56) References Cited

U.S. PATENT DOCUMENTS

| | | | |
|---|---|---|---|
| 5,406,123 | A | 4/1995 | Narayan |
| 5,741,724 | A * | 4/1998 | Ramdani et al. ............. 438/46 |
| 5,793,061 | A | 8/1998 | Ohuchi et al. |
| 5,796,771 | A | 8/1998 | DenBaars et al. |
| 6,281,426 | B1 | 8/2001 | Olson et al. |
| 6,498,050 | B2 | 12/2002 | Fujimoto |
| 6,518,077 | B2 | 2/2003 | Narayan et al. |
| 6,605,486 | B2 | 8/2003 | Fujimoto |
| 6,759,139 | B2 | 7/2004 | Kunisato et al. |
| 6,844,084 | B2 | 1/2005 | Kokta et al. |
| 6,951,819 | B2 | 10/2005 | Iles et al. |
| 6,955,985 | B2 | 10/2005 | Narayan |
| 7,012,283 | B2 | 3/2006 | Tsuda et al. |
| 7,122,733 | B2 | 10/2006 | Narayanan et al. |
| 7,122,734 | B2 * | 10/2006 | Fetzer et al. ............. 136/252 |
| 7,211,836 | B2 | 5/2007 | Udagawa |
| 7,220,324 | B2 | 5/2007 | Baker et al. |
| 7,323,764 | B2 | 1/2008 | Wallis |
| 7,390,684 | B2 | 6/2008 | Izuno et al. |
| 7,598,108 | B2 | 10/2009 | Li et al. |
| 7,601,215 | B1 | 10/2009 | Wang |
| 7,615,400 | B2 | 11/2009 | Goto et al. |
| 8,507,365 | B2 | 8/2013 | Norman et al. |
| 8,575,471 | B2 | 11/2013 | Norman et al. |
| 2002/0144725 | A1 | 10/2002 | Jordan et al. |
| 2003/0015728 | A1 | 1/2003 | Bosco et al. |
| 2003/0162271 | A1 | 8/2003 | Zhang et al. |
| 2004/0079408 | A1 | 4/2004 | Fetzer et al. |
| 2004/0166681 | A1 | 8/2004 | Iles et al. |
| 2005/0124161 | A1 | 6/2005 | Rawdanowicz et al. |
| 2006/0060237 | A1 | 3/2006 | Leidholm et al. |
| 2006/0126688 | A1 | 6/2006 | Kneissl |
| 2006/0130745 | A1 | 6/2006 | Narayan |
| 2006/0162767 | A1 | 7/2006 | Mascarenhas et al. |
| 2006/0236923 | A1 | 10/2006 | Kouvetakis et al. |
| 2007/0243703 | A1 | 10/2007 | Pinnington et al. |
| 2008/0029151 | A1 | 2/2008 | McGlynn et al. |
| 2008/0067547 | A1 | 3/2008 | Bergman et al. |
| 2008/0191203 | A1 | 8/2008 | Fujioka et al. |
| 2008/0217622 | A1 | 9/2008 | Goyal |
| 2008/0230779 | A1 | 9/2008 | Goyal |
| 2008/0245409 | A1 | 10/2008 | Varghese et al. |
| 2008/0265255 | A1 | 10/2008 | Goyal |
| 2008/0308836 | A1 | 12/2008 | Nakahara et al. |
| 2009/0032799 | A1 | 2/2009 | Pan |
| 2009/0042344 | A1 | 2/2009 | Ye et al. |
| 2009/0044860 | A1 | 2/2009 | Pan et al. |
| 2009/0045393 | A1 | 2/2009 | Nakahara |
| 2009/0065047 | A1 | 3/2009 | Fiorenza et al. |
| 2009/0078311 | A1 | 3/2009 | Stan et al. |
| 2009/0087941 | A1 | 4/2009 | Goto et al. |
| 2009/0140296 | A1 | 6/2009 | Park et al. |
| 2009/0155952 | A1 | 6/2009 | Stan et al. |
| 2009/0229662 | A1 | 9/2009 | Stan et al. |
| 2009/0283793 | A1 | 11/2009 | Osawa et al. |
| 2010/0206537 | A1 | 8/2010 | Ikeda et al. |
| 2010/0212729 | A1 | 8/2010 | Hsu |
| 2010/0218813 | A1 | 9/2010 | Guha et al. |
| 2011/0048514 | A1 | 3/2011 | Norman et al. |
| 2011/0062446 | A1 | 3/2011 | Goyal |
| 2011/0147791 | A1 | 6/2011 | Norman et al. |

FOREIGN PATENT DOCUMENTS

| | | |
|---|---|---|
| WO | 2004025707 | 3/2004 |
| WO | 2006033858 | 3/2006 |
| WO | 2007025062 | 3/2007 |
| WO | 2008112115 | 4/2008 |
| WO | 2008112115 | 9/2008 |
| WO | 2009096931 | 8/2009 |
| WO | 2009096932 | 8/2009 |
| WO | 2009110872 A2 | 9/2009 |
| WO | 2009110872 A3 | 12/2009 |

OTHER PUBLICATIONS

Sands, et al., "Epitaxial growth of GaAs/NiA/GaAs heterostructures," Applied Physics Letters, vol. 52, Issue 15, Apr. 11, 1988, pp. 1216-1218.

Sands, et al, "Expitaxial Metal (NiAl)—Semiconductor (III-V) Heterostructures by MBE," Surface Science, vol. 228, Issues 1-3, Apr. 1990, pp. 1-8.

Scarpulla, et al., "GdN (1 1 1) heteroepitaxy on GaN (0 0 0 1) by N2 plasma and NH3 molecular beam expitaxy," Journal of Crystal Growth, vol. 311, Issue 5, Feb. 1, 2009, pp. 1239-1244.

Sun, et al., "Mg-doped green light emitting diodes over cubic (111)MgAl2O4 substrates," Applied Physics Letters, vol. 70, Issue 11, Mar. 17, 1997, pp. 1444-1446.

Suzuki, et al., "MBE growth of GaN on MgO substrate," Journal of Crystal Growth, vols. 301-202, Apr. 2007, pp. 478-481.

Tadayon, et al., "Growth of GaAs-Al-GaAs by migration-enhanced epitaxy," Applied Physics Letters, vol. 53, Issue 26, Dec. 26, 1988, pp. 2664-2665.

Tinjod, et al, "Alumina-rich spinel" A new substrate for the growth of high quality GaN-based light-emitting diodes, Journal of Crystal Growth, vol. 285, Issue 4, Dec. 15, 2005, pp. 450-458.

Tolle, et al., "Epitaxial growth of group III nitrides on silicon substrates via a reflective lattice-matched zirconium diboride buffer layer," Applied Physics Letters, vol. 82, Issue 15, Apr. 14, 2003, pp. 2398-2400.

Tsuchiya, et al., "Initial stages of InN thin film growth onto MgAl2O4(111) and α-Al2O3(0 0 • 1)substrates," Journal of Crystal Growth, vol. 220, Issue 3, Dec. 2000), pp. 191-196.

Vurgaftman, et al., "Band parameters for nitrogen-containing semiconductors," Journal of Applied Physics, vol. 94, Issue 6, Sep. 15, 2001, pp. 3675-3696.

Yang et al., "Microstructure evolution of GaN buffer layer on MgAl2O4 substrate," Journal of Crystal Growth, vol. 193, Issue 4, Oct. 15, 1998, pp. 478-483.

Yamada, et al., "Strong photoluminescene emission from polycrystalline GaN layers grown on W, Mo, Ta, and Nb metal substrates," Applied Physics Letters, vol. 78, Issue 19, May 7, 2001, pp. 2849-2851.

Yao, et al., "Fabrication of AlAs/Al/AlAs heterostructures by molecular beam epitaxy and migration enhanced eptaxity," Journal of Crystal Growth, vol. 111, Issues 1-4, May 2, 1991, pp. 221-227.

Wang, et al., "Lattice Parameters and Local Lattice Distortions in fcc-Ni-Solutions," Metallurgical and Materials Transactions A, vol. 38A, Mar. 2007, pp. 562-569.

Zhao, et al., "Transmission electron microscope study on electrodeposited Gd2O3 and Gd2Zr2O7 buffer layers for YBa2Cu3O7-ōsuperconductors," Physica C, vol. 478, Issue 14, Jul. 15, 2008, pp. 1092-1096.

Narayan, et al., "Domain epitaxy: A unified paradigm for thin film growth," Journal of Applied Physics vol. 93, No. 1, Jan. 1, 2003, pp. 278-285.

Goyal, et al., "Low Cost, Single Crystal-like Substrates for Practical, High Efficiency Solar Cells," AIP Conf. Proc. vol. 404, Sep. 1, 1997, pp. 377-394.

Ohta, et al., "Epitaxial growth of InN on nearly lattice-matched (Mn,Zn)Fe2O4," Solid State Communictions, vol. 137, Issue 4, Jan. 2006, pp. 208-211.

(56) References Cited

OTHER PUBLICATIONS

Trampert, "Heteroepitaxy of dissimilar materials; effect of interface structure on strain and defect formation," Physica E, vol. 12, Issues 2-4, Mar. 2002, pp. 1119-1125.

Yang, et al., "InGaNGaN based light emitting diodes over (111) spinel substrates," Applied Physics Letters, vol. 69, Issue 3, Jul. 15, 1996, pp. 369-370.

Zhou, "Metal-oxide interfaces at the nanoscale," Applied Physics Letters, vol. 94, Issue 23, Jun. 9, 2009, pp. 233115-1-233115-3.

Armitage, et al., "Lattice-matched HfN buffer layers for epitaxy of GaN on Si," Applied Physics Letters, vol. 81, Issue 8, Aug. 19, 2002, pp. 1450-1452.

Hooks, et al., "Epitaxy and Molecular Organization on Solid Substrates," Advanced Materials, vol. 13, Issue 4, Feb. 19, 2001, pp. 227-241.

Zheleva et al., "Epitaxy growth in large lattice mismatch systems," Journal of Applied Physics, vol. 75, Issue 2, Jan. 15, 1994, pp. 860-871.

Narayan, "New Frontiers in Thin Film Growth and Nanomaterials" Metallurgical and Materials Transactions B, vol. 36B, Issue 1, Feb. 2005, pp. 5-22.

Okamoto, et al., "Instabailities in the growth of AlxGa(1-x)AsAlyGa(1-y) structures by molecular beam epitaxy," Journal of Applied Physics, vol. 53, Issue 3, Mar. 1, 1982, pp. 1532-1535.

Schermer, et al., "High rate expitaxial lift-off of InGaP films for GaAs substrates," Applied Physics Letters, vol. 76, Issue 15, Apr. 15, 2000, pp. 2131-2133.

Yu, et al., "Diffuson reactions at Al-MgAl2O4 interfaces—and the effect of applied electric fields," Journal of Material Science, vol. 41, Issue 23, Dec. 23, 2006, pp. 7785-7797.

Schweinfest et al., "High-recision assessment of interface lattice offset by quantitative HRTEM," Journal of Microscopy, vol. 194, Issue 1, Apr. 1999, pp. 142.

Schweinfest et al., "Atomistic and electronic strucutre of Al/MgAl2O4 and Ag/MgAl2O4 interfaces," Philosophical Magazine, vol. 81, Issue 4, 2001, pp. 927-955.

Yamada "Ionized Cluster Beam Deposition and Epitaxy of Metal Films on Large Lattice Misfit Substrates," Physica Scripta, vol. T35, 1991, pp. 245-250.

Miura et al., "Single-crystal Al growth on Si(111) by low-temparature molecular beam epitaxy," Applied Physics Letters, vol. 62, Issue 15, Apr. 12, 1993, pp. 1751-1753.

Fortuin et al., "Characterization of single-crystalline Al films grown on Si(111)," Surface Science, vol. 366, Issue 2, Oct. 20, 1996, pp. 285-294.

Yamada et al., "Large-misfit heteroepitaxy of aluminum films by ICB deposition," Nuclear Instruments and Methods in Physics Research Section B, vol. 59-60, Jul. 1991, pp. 302-307.

Ueno et al., "Epitaxial Al Schottky contacts formed on (111) GaAs," Applied Physics Letters, vol. 56, vol. 21, Issue 22, May 28, 1990, pp. 2204-2206.

Thangaraj et al., "Expitaxial growth of (011) Al on (100) Si by vapor deposition," Applied Physics Letters, vol. 61, Issue 1, Jul. 6, 1992, pp. 37-39.

Thangaraj et al., "Expitaxial growth of (001) Al on (111) Si by vapor deposition,"Applied Physics Letters, vol. 61, Issue 8, Aug. 24, 1992, pp. 913-915.

Sosnowski et al., "Importance of steps in heteroepitaxy: The case of aluminum on silicon," Applied Physics Letters, vol. 65, Issue 23, Dec. 5, 1994, pp. 2943-2945.

Buschel et al., "RHEED Studies of MBE-grown Aluminium Layers on {111}-Oriented Silicon Substrates," Crystal Research and Technology, vol. 26, Issue 2, 1991, pp. 211-215.

Tempel et al., "The Epitaxial Orientation of Al on Si," Crystal Research and Technology, vol. 28, Issue 3, 1993, pp. 317-324.

Zur et al., "Lattice match: An application to heteroepitaxy," Journal of Applied Physics, vol. 55, Issue 2, Jan. 15, 1984, pp. 378-386.

PCT/US10/58535 International Preliminary Report on Patentability dated Jun. 4, 2013.

PCT/US10/58535 Written Opinion dated Mar. 3, 2011.

PCT/US10/58514 International Search Report and Written Opinion dated Apr. 6, 2011.

Nakajima et al., "Growth of Single-Crystal Aluminum Films on Silicon Substrates by DC Magnetron Sputtering," Japanese Journal of Applied Physics, vol. 31, Part 1, No. 6A, Jun. 15, 1992, pp. 1860-1867.

Yokoyama et al., "Single-Crystal Growth of Al(110) on Vicinal Si(100) in Ultra-High-Vacuum Sputtering System," Japanese Journal of Applied Physics, vol. 30, Part 1, No. 12B, Dec. 30, 1991, pp. 3685-3690.

Andrianov, et al., "Time-Resolved Photoluminescence of Polycrystalline GaN Layers of Metal Substrates", Semidconductors, vol. 36, No. 8, Aug. 2002, pp. 878-882.

As, et al., "Heteroepitaxy of Doped and Undoped Cubic Group III-Nitrides", physica status solidi (a), vol. 176, Nov. 1999, pp. 475-485.

Asahi, et al., "Strong Photoluminescence Emission from Polycrystalline GaN Grown on Metal Substrate by NH3 Source MBE", physica status solidi (a), vol. 188, No. 2, Dec. 2001, pp. 601-604.

Haxel, et al. "Rare Earth Elements—Critical Resources for High Technology", U.S. Geological Survey Fact Sheet 087-02, Nov. 2002, pp. 1-4.

Bailey, et al. "Thin Film Poly III-V Space Solar Cells", Proceedings of the 33rd IEEE PVSC, May 2007, pp. 1-5, San Diego, California.

Baker, et al., "Characterization of Planner Semipolar Gallium Nitride Films on Spinel Substrates", Japanese Journal of Applied Physics, vol. 44, No. 29, Jul. 2005, pp. L920-L922.

Baur, et al., "Triple-Junction III-V Based Concentrator Solar Cells: Perspectives and Challenges", Journal of Solar Energy Engineering, vol. 129, Aug. 2007, pp. 258-265.

Bergh, et al., "The Promise and Challenge of Solid-State Lighting", Physics Today, Dec. 2001, pp. 42-47.

Oh, et al., "Epitaxial Growth and Characterization of GaAs/Al/GaAs Herterostructures", Surface Science, 1990, vol. 228, Apr. 1990, pp. 16-19.

Bhattacharya, et al., "Growth and characterization of GaAs/Al/GaAs heterostructures", Journal of Applied Physiology, vol. 67, No. 8, Apr. 15, 1990, pp. 3700-3705.

Cantoni, et al., "Reflection high-energy electron diffraction studies of epitaxial oxide seed-layer growth on rolling-assisted biaxially textured substrate Ni (001): The role of surface structure and chemistry", Applied Physics Letters, vol. 79, No. 19, Nov. 5, 2001, pp. 3077-3079.

Cho, et al., "Single-crystal-aluminum Schottky-barrier diodes prepared by molecular-beam epitaxy (MBE) on GaAs", Journal of Applied Physiology, vol. 49, No. 6, Jun. 1978, pp. 3328-3332.

Efimov, et al., "On an Unusaul Azimuthal Orientational Relationship in the System Gallium Nitride Layer on Spinel Substrate", Crystallography Reports, 45, No. 2, Mar. 2000, pp. 312-317.

Feltrin, et al., "Material considerations for terawatt level deployment of photovoltaics", Renewable Energy, vol. 33 Issue 2, Feb. 2008, pp. 180-185.

Findikoglu, et al., "Aligned-Crystalline Silicon Films on Non-Single-Crystalline Substrates", Los Alamos National Laboratory publication, MRS, 2006, Report No. LA-UR-06-1165, pp. 1-11.

Freitas, Jr., et al., "Properties of epitaxial GaN on refractory metal substrates", Applied Physics Letters, 2007, vol.90, Issue 9, Feb. 26, 2007, pp. 091910-1-091910-3.

Fritzemeier, et al., "Progress Toward High Efficiency Thin Film Photovoltaics", High-Performance PV—2007 Program Review Meeting, 2007, pp. 1-2.

Geisz, et al., "III-N-V semiconductors for solar photovoltaic applications", Semiconductor Science and Technology, vol. 17, Issue 8, Jul. 10, 2002, pp. 769-777.

Geisz, et al., "High-efficiency GaInP/GaAS/InGaAs triple-junction solar cells grown inverted with a metamorphic bottom junction", Applied Physics Letters, vol. 91, Issue 2, Jul. 9, 2007, pp. 023502-1-023502-3.

Geisz, et al., "40.8% efficient inverted triple-junction solar cell with two independently metamorphic junctions", Applied Physics Letters, vol. 93, Issue 12, Sep. 22, 2008, pp. 123505-1-123505-3.

(56) References Cited

OTHER PUBLICATIONS

George, et al., "Novel symmetry in the growth gallium nitride on magnesium aluminate substrates", Applied Physics Letters, vol. 68, No. 3, Jan. 15, 1996, pp. 337-339.

Goyal, et al., "The RABiTS Approach: Using Rolling-Assisted Biaxially Textured Substrates for High-Performance YBCO Superconductors", MRS Bulletin, Aug. 2004, pp. 552-561.

Haworth, et al., Investigation into the influence of buffer and nitrided layers on the initial stages of GaN growth on InSb (100), Applied Surface Science, vol. 166, Issues 1-4, Oct. 9, 2000, pp. 418-422.

Hirata, et al., "Epitaxial growth of AlN films on single-crystalline Ta substrates", Journal of Solid State Chemistry, vol. 180, Issue 8, Aug. 2007, pp. 2335-2339.

Hu, et al., "Nucleation and growth of epitaxial $ZrB_2(0\ 0\ 0\ 1)$ on Si (1 1 1)", Journal of Crystal Growth, Jul. 1, 2004, vol. 267, Issues 1-4, pp. 554-563.

Inoue, et al., "Epitaxial growth of AlN on Cu (1 1 1) substrates using pulsed paser deposition", Journal of Crystal Growth, vol. 289, Issue 2, Apr. 2006, pp. 574-577.

Inoue, et al., "Epitaxial growth of GaN on copper substrates", Applied Physics Letters, Jun. 26, 2006, vol. 88, Issue 26, Jun. 26, 2006, pp. 261910-1-261910-3.

Khan, et al., "Cleaved cavity optically pumped InGaN-GaN laser grown on spinel substrates", Applied Physics Letters, vol. 69, Issue 16, Oct. 14, 1996, pp. 2418-2420.

King, et al., "40% efficient metamorphic GaInP/GaInAs/Ge multijunction solar cells", Applied Physics Letters, vol. 90, Issue 18, Apr. 30, 2007, pp. 183516-1-183516-3.

King, "Multifunction solar cells used in concentrator photovoltaics have enabled record-breakiong efficiencies in electricity generation from the Sun's energy, and have the potential to make solar electricity cost-effective at the utility scale", Nature Photonics, May 2008, vol. 2, pp. 284-286.

Kuo, "Bowing parameter of zincblende $In_xGa_{1-x}N$", Optics Communications, 2007, vol. 280, pp. 153-156.

Kuramata, et al., "Properties of GaN Epitaxial Layer Grown on (111) $MgAl_2O_4$ Substrate", Solid-State Electronics, vol. 41, Issue 2, Feb. 1997, pp. 251-254.

Li, et al., "Room temperature green light emission from nonpolar cubic InGaN/GaN multi-quantum-wells", Applied Physics Letters, vol. 90, Issue 7, Feb. 12, 2007, pp. 071903-1-071903-3.

Li, et al., "Room-Temperature Epitaxial Growth of GaN on Atomically Flat $MgAl_2O_4$ Substrates by Pulsed-Laser Depostition", Japanese Journal of Applied Physics, vol. 45, No. 17, May 2006, pp. L457-L459.

Li, et al., "Epitaxial growth of single-crystalline AlN films on tungsten substrates", Applied Physics Letters, vol. 89, Issue 24, Dec. 11, 2006, pp. 241905-1-241905-3.

Lieten, et al., "Suppression of domain formation in GaN layers grown on Ge (1 1 1)", Journal of Crystal Growth, vol. 311, Issue 5, Feb. 15, 2009, pp. 1306-1310.

Ludeke, "Morphological and chemical considerations for the epitaxy of metals on semiconductors", Journal of Vacuum Science & Technology. B, Microelectronics and nanometer structures : processing, measurement, and phenomena : an official journal of the American Vacuum Society, vol. 2, Issue 3, Jul.-Sep. 1984, pp. 400-406.

Massies, et al., "Epitaxial Relationships between Al, Ag and GaAs{001} Surfaces", Surface Science, vol. 114, Issue 1, Jan. 2, 1982, pp. 147-160.

Mikulics, et al, "Growth and properties of GaN and AlN layers on silver substrates", Applied Physics Letters, vol. 87, Issue 21, Nov. 2005, pp. 212109-1-212109-3.

Mitamura, et al., "Growth of InN films on spinel substrates by puled laser deposition", physica status solidi (RRL)—Rapid Research Letters, Oct. 2007, vol. 1, Issue 5, Oct. 2007, pp. 212-213.

Nikishin, et al., "Gas source molecular beam epitaxy of GaN with hydrazine on spinel substrates", Applied Physics Letter, vol. 72, Issue 9, May 11, 1998, pp. 2361-2363.

Norman, et al., "Low cost III-PV on A1-foil substrates", FY09 AOP Proposal—Seed Fund Project, 2009, pp. 1-5.

Norton, et al., "Epitaxial $YBa_2Cu_3O_7$ on Biaxially Textured Nickel (001): An Approach to Superconducting Tapes with High Critical Current Density", Science, vol. 274, Nov. 1, 1996, pp. 755-757.

Pacheco-Salazar, et al., "Photoluminescence measurements on cubic InGaN layers deposited on a SiC substrate", Semiconductor Science and Technology, vol. 21, No. 7, Jul. 2006, pp. 846-851.

Palmstøm, "Epitaxy of Dissimilar Materials", Annual Review of Materials Science, vol. 25, Aug. 1995, pp. 389-415.

Pan, et al., "Increasing cube texture in high purity aluminium foils for capacitors", Materials Science and Technology, vol. 21, Issue 12, Dec. 2005, pp. 1432-1435.

Phillips, et al., "Research challenges to ultra-efficient inorganic solid-state lighting", Laser & Photonics Reviews, Dec. 2007, vol. 1, Issue 4, Dec. 2007, pp. 307-333.

Phillips, et al., "UK cracks GaN-on-silicon LEDs", Compound Semidconductor, vol. 15, No. 2, Mar. 2009, pp. 19-22.

Pilkington, et al., "The growth of epitaxial aluminium on as containing compound semiconductors", Journal of Crystal Growth, vol. 196, Issue 1, Jan. 1999, pp. 1-12.

Sacks, et al., "Growth and characterization of epitaxial $Fe_xAl_{1-x}$/(In,Al)As/InP and III-V/$Fe_xAl_{1-x}$/(In,Al)As/InP structures", Journal of Vacuum Science & Technology. B, Microelectronics and nanometer structures : processing, measurement, and phenomena : an official journal of the American Vacuum Society, May/Jun. 1999, vol. 17, No. 3, pp. 1289-1293.

\* cited by examiner

METHODS OF PRODUCING FREE-STANDING SEMICONDUCTORS USING SACRIFICIAL BUFFER LAYERS AND RECYCLABLE SUBSTRATES

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

CROSS-REFERENCE TO RELATED APPLICATION

This patent application is related to PCT Application No. PCT/US10/58535, entitled "Coincident Site Lattice-Matched Growth of Semiconductors on Substrates using Compliant Buffer Layers," filed on the same day as the present application, which is hereby incorporated by reference as though fully set forth herein.

BACKGROUND

High-performance semiconductor devices often incorporate at least one layers of substantially crystalline semiconductor materials. Highly efficient III-V multi-junction photovoltaic solar cells incorporate III-V crystalline semiconductor materials such as GaInAs and GaInAlP alloy that are produced using epitaxy on single crystal Ge or GaAs substrates. High efficiency light emitting diodes (LEDs) and diode lasers may be fabricated from epitaxially grown nitride semiconductors such as InGaN. High electron mobility transistors may incorporate epitaxially grown arsenide or antimonide semiconductor materials such as InAs and InSb.

The semiconductor materials used in these high-performance semiconductor devices are typically selected based on optoelectronic performance criteria such as the specific band gap or electron mobility of the material. The function of these semiconductor devices is essentially governed by the optoelectronic properties and arrangement of the device's semiconductor materials. Further, the quality of the crystalline semiconductor materials of these devices impact their overall performance; defects, impurities and other flaws in the crystalline structure of the semiconductor materials may degrade the performance of the semiconductor devices.

Typically, high-performance semiconductor devices are fabricated using an epitaxial growth process in which a monocrystalline semiconductor material is deposited on a monocrystalline substrate material. However, the ability to produce low-defect crystals of the semiconductor materials used in high-performance semiconductor devices is constrained by several factors. Typically, the crystal lattice dimensions of the substrate must be closely matched to the corresponding lattice of the epitaxially deposited semiconductor material in order to avoid lattice mismatching that may introduce internal stresses that may induce undesired defects in the semiconductor material. Further, if the thermal expansion properties of the substrate material are significantly different from the corresponding thermal expansion properties of the semiconductor material, the temperature range experienced by the device during typical epitaxial growth processes may induce differential swelling and shrinking of the substrate material relative to the deposited semiconductor material, resulting in cracking and other undesired defects.

Existing semiconductor fabrication methods use a number of approaches to avoid the development of defects in the crystalline semiconductor materials. In many methods, the substrate material may be selected to be lattice-matched to the deposited semiconductor material. For example, III-V multi-junction photovoltaic cells may be grown on a Ge or GaAs substrate that is lattice-matched to the deposited III-V semiconductor alloy materials of the device. However, many of the substrate materials that are lattice-matched to desirable III-V semiconductor materials may be difficult to obtain in single-crystal form of suitable quality, may be relatively rare or prohibitively expensive, or may be difficult to obtain or produce in large quantities or suitable sizes. In the case of some III-V semiconductors, such as the InGaN alloys used in high-performance LEDs, a suitable lattice-matched substrate may not exist.

To reduce the stresses introduced by a lattice mismatch between the substrate and the deposited semiconductor material, some existing fabrication methods make use of a series of graded buffer layers, in which the lattice of the buffer layer closest to the substrate is slightly mismatched with the lattice of substrate, and the uppermost buffer layer is only slightly mismatched with the semiconductor material to be deposited. The intermediate buffer layers are designed to gradually transition from the buffer lattice dimensions to the semiconductor lattice dimensions, and the number of buffer layers used depends in part upon the degree of lattice mismatch between the substrate and the semiconductor. However, stresses may still occur between successive buffer layers that may result in defects that may impact device performance. In addition, the introduction of graded buffer layers between the substrate and the deposited semiconductor may result in added process complexity and expense, and the introduction of impurities that may also impact device performance.

A need exists for a method of producing low-defect density crystalline semiconductor materials using epitaxial deposition on relatively inexpensive and widely available substrates without need for complex process methods such as multiple graded buffer layers. This production method may be used for the fabrication of high-performance semiconductor devices such as high efficiency photovoltaic cells, high performance LEDs, and high electron mobility transistors. The foregoing examples of the related art and limitations related therewith are intended to be illustrative and not exclusive. Other limitations of the related art will become apparent to those of skill in the art upon a reading of the specification and a study of the drawings

SUMMARY

The following embodiments and aspects thereof are described and illustrated in conjunction with systems, tools and methods which are meant to be exemplary and illustrative, not limiting in scope. In various embodiments, at least one of the above-described problems have been reduced or eliminated, while other embodiments are directed to other improvements.

Aspects of the present disclosure provide a method of producing a semiconductor device. The method includes providing a providing a spinel substrate that includes a crystalline surface and growing a crystalline buffer material on the crystalline surface by coincident site lattice-matching epitaxy to form a sacrificial buffer layer. The method further includes growing a first crystalline semiconductor material on the sacrificial buffer layer by lattice-matching epitaxy or coincident site lattice-matching epitaxy to form a device layer on the sacrificial buffer layer. In addition, the method includes separating the device layer from the crystalline spinel substrate surface using an epitaxial liftoff method to produce the semiconductor device that includes the device layer. The epitaxial liftoff method is chosen from chemical etching of the crystalline buffer material or melting of the buffer material.

Other aspects further provide a semiconductor device that includes a spinel substrate that includes a crystalline spinel surface and a sacrificial buffer layer that includes a crystalline buffer material, an upper buffer surface, and a lower buffer surface. The lower buffer surface is coincident site lattice-matched to the crystalline spinel substrate. The device further includes a first device layer that includes a first crystalline semiconductor material, a first device layer upper surface, and a first device layer lower surface. The first device layer lower surface is coincident site lattice-matched to the upper buffer surface.

In one particular arrangement, a semiconductor device is provided that includes a crystalline spinel substrate that includes $MgAl_2O_4$, as well as a sacrificial buffer layer that includes crystalline Al, in which the sacrificial buffer layer is coincident site lattice-matched to the crystalline spinel substrate. The device also includes a first device layer that includes a first crystalline semiconductor material chosen from III-V semiconductor materials, III-V semiconductor alloys, II-VI semiconductor materials, and II-VI semiconductor alloys. The first device layer is coincident site lattice-matched to the sacrificial buffer layer.

The method of producing a semiconductor device provided herein overcomes many of the limitations of previous fabrication methods. The use of coincident lattice-matching epitaxy makes possible the deposition of a wider variety of materials, including compliant buffer layer materials such as aluminum, on relatively inexpensive and/or commonly available materials such as spinel with a relatively low density of defects. Because spinel is a tough and durable material that is resistant to degradation by a wide variety of chemical agents, a spinel substrate may be reused to fabricate additional semiconductor devices. Further, the inclusion of the sacrificial buffer layer that includes a material that is compatible with epitaxial liftoff methods, such as Al, provides a surface upon which a wide variety of semiconductor materials may be deposited using coincident site lattice-matching epitaxy to produce at least one device layers with relatively low defect densities. The semiconductor devices produced using this method, including but not limited to LEDs, photovoltaic (PV) solar cells, and transistors possess enhanced performance as a result of the relatively low defect densities in the semiconductor materials included in the devices.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 2A and FIG. 2B are schematic diagrams illustrating the interface of the unit cells of a fcc lattice based crystalline semiconductor material epitaxially grown on a fcc lattice crystalline substrate material.

(FIG. 9A), 300° C. (FIG. 9B), and room temperature (FIG. 9C).

Corresponding reference characters and labels indicate corresponding elements among the view of the drawings. The headings used in the figures should not be interpreted to limit the scope of the claims.

DETAILED DESCRIPTION

A method of producing a semiconductor device is provided that overcomes many of the limitations of previous production methods. The method includes providing a spinel substrate and forming a sacrificial buffer layer by growing a crystalline buffer material such as aluminum onto the crystalline surface by coincident site lattice-matching epitaxy. This crystal of buffer material resulting from this process may have relatively few defects due to the close lattice-matching afforded by the coincident site lattice-matching epitaxy process. The buffer material may further possess desirable properties including malleability for absorbing internal stresses, as well as a chemical structure that is compatible with existing epitaxial liftoff process such as chemical etching.

The method may further include forming a device layer by growing a first crystalline semiconductor material on the sacrificial buffer layer using a lattice-matching epitaxial process or a coincident site lattice-matching epitaxial process. At least one additional crystalline semiconductor material may be grown on the first crystalline semiconductor material using lattice-matching epitaxy.

The method further includes separating the device layer from the crystalline surface using an epitaxial liftoff method such as chemical etching of the sacrificial buffer layer to produce the semiconductor device depending upon the particular device to be produced. The spinel substrate may be further processed using suitable techniques such as acid etching and polishing to refurbish the substrate surface, and recycled for use as a substrate in the production of additional semiconductor products.

This method of producing a semiconductor device overcomes many previous limitations of existing semiconductor methods. The spinel substrate is a relatively inexpensive and structurally tough substrate material, is inert to many chemicals, and the lattice structure of spinel is compatible with coincident site lattice-matching epitaxial deposition of a variety of buffer materials, resulting in a buffer material with relatively few lattice defects. The buffer material may be compatible with lattice-matched and coincident site lattice-matching epitaxial deposition of a variety of semiconductor materials, and the material may further be malleable and capable of absorbing internal stresses during the fabrication process. The recycling of the spinel substrate further reduces production costs of semiconductor fabrication using this method.

A semiconductor device produced using the method described above is further provided. Non-limiting examples of semiconductor devices that may be produced using this method include photovoltaic solar cells, LEDs, lasers, transistors, and light detectors.

Aspects of the method of producing a semiconductor device and exemplary semiconductor devices using this method are described in detail below.

I. Methods of Producing III-V Semiconductor Devices

A method of producing a III-V semiconductor device is provided that includes forming a sacrificial buffer layer and at least one layer of crystalline semiconductor on a spinel substrate and then separating the at least one layer of semiconductor material from the spinel substrate using an epitaxial liftoff technique such as chemical etching. As used herein, III-V semiconductor materials refer to crystalline semiconductor materials containing one element from Group III (B, Al, Ga, In, Tl) and one element from Group V (N, P, As, Sb, and Bi). As used herein, III-V semiconductor devices refer to optoelectronic and electrical devices such as light emitting diodes and photovoltaic cells which include a III-V semiconductor material in its construction. The sacrificial buffer layer and the first semiconductor layer are produced using lattice-matching epitaxy and/or coincident site lattice-matching epitaxy, resulting in the production of crystalline layers that are relatively free of defects that may degrade the performance of the semiconductor device.

a. Coincident Site Lattice-Matching Epitaxy

Epitaxy, as defined herein, relates to a process in which one crystalline material is grown or deposited on another crystalline substrate in an ordered manner. Depending on the particular lattice structures of the deposited material and the substrate, the epitaxial process may result in varying degrees of lattice-matching at the interface between the deposited material and the substrate. Mismatched lattices typically introduce internal stresses to the deposited crystalline material that may induce defects within the crystalline material that may degrade the performance of a device containing this material.

Figure 1A:
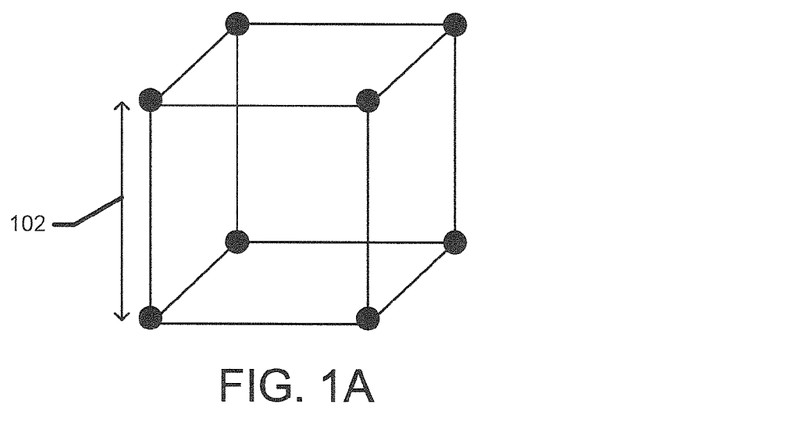
FIG. 1A is a schematic diagram of a simple cubic crystal lattice.
Figure 1B:
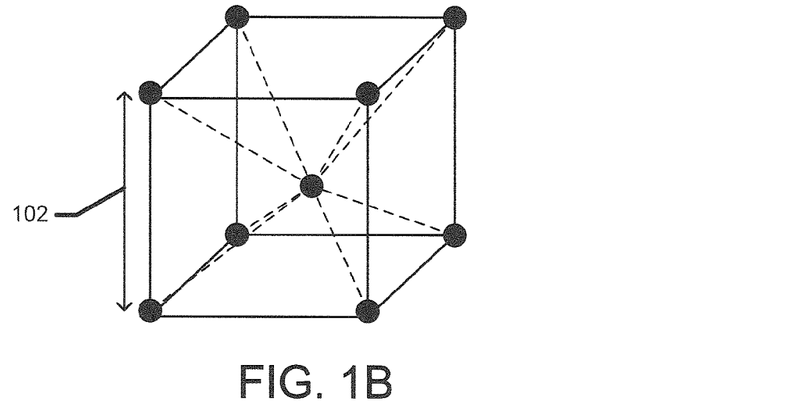
FIG. 1B is a schematic diagram of a body-centered cubic crystal lattice.
Figure 1C:
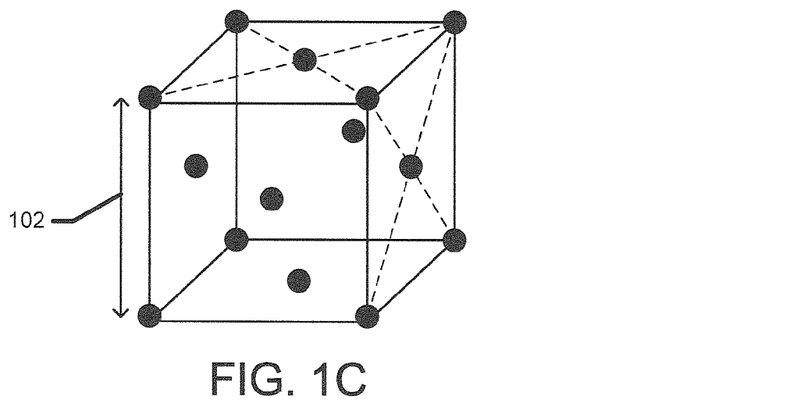
FIG. 1C is a schematic diagram of a face-centered cubic (fcc) crystal lattice.

The lattice structure of a crystalline material may be specified by a lattice parameter (a), defined herein as the length between unit cells in a crystal lattice. For example, three space lattice types of the cubic crystal system are illustrated in FIG. 1: a simple cubic structure 100 (FIG. 1A), a body-centered cubic structure 100A (FIG. 1B), and a face-centered cubic structure 100C (FIG. 1C). In each of the three structures, the lattice parameter (a), referred to as 102 in FIG. 1A-FIG. 1C, corresponds to the length of any face of the cubic unit cell.

During the process of lattice-matching epitaxy, the crystal lattices of the deposited material are layered directly on top of the substrate lattices. For example, a material having a simple cubic structure shown in FIG. 1A may be layered on top of substrate material having the same simple cubic structure. So long as the deposited material and the substrate material have similar lattice constants, each atom in the deposited material's lattice will be aligned with a corresponding atom in lattice at the surface of the substrate, resulting in minimal internal stresses and defects at the interface of the substrate and the deposited material.

For a given substrate with a suitable lattice structure, the materials that may be deposited directly on the substrate using lattice-matching epitaxy are typically limited to those materials having lattice constants that are within about 2% or less of the substrate's lattice constant. However, materials with lattice constants that are significantly mismatched with the lattice constant of the substrate may be deposited using coincident site lattice-matching epitaxy, as shown in FIG. 2. Coincident site lattice-matching epitaxy, as defined herein, is an epitaxy process in which a material having a lattice constant that is different from the lattice constant of the substrate is deposited with a high degree of lattice-match by virtue of a scaled or rotated lattice-match. It is to be noted that lattice-matching epitaxy may be defined as a special case of coincident site lattice-matching epitaxy in which a 1:1 ratio of the lattice constants of the substrate and deposited material results in a scaled lattice-match.

Figure 2A:
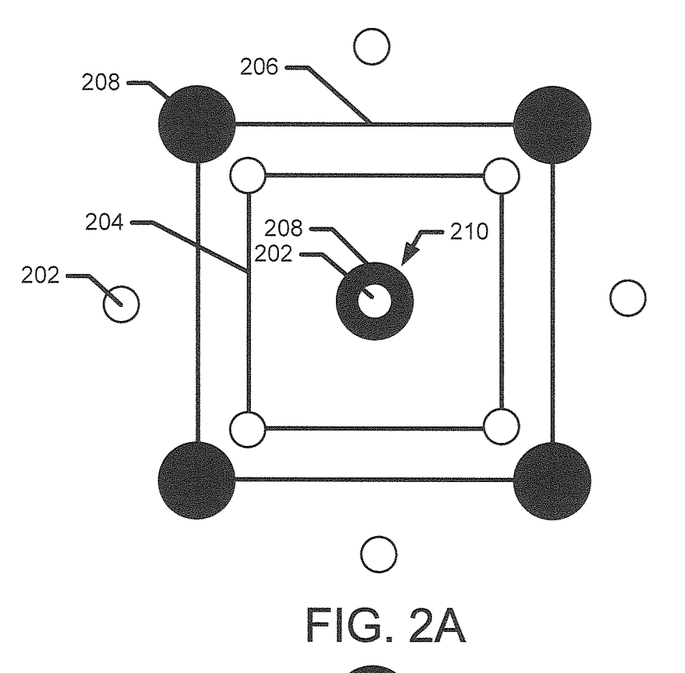
FIG. 2A illustrates an interface produced using non-coincident site lattice-matching epitaxial growth.

FIG. 2 illustrates an example of the coincident site lattice-matching epitaxy of a substrate 202 having a lattice constant 204 that is different than the lattice constant 206 of the deposited material 208 by virtue of a rotated lattice-match. FIG. 2A illustrates the interface of the substrate 202 and the deposited material 208 using lattice-matching epitaxy. Lattice-matching epitaxy results in significant lattice mismatching, because the lattices of the substrate and the deposited material are matched at only a single point 210.

Figure 2B:
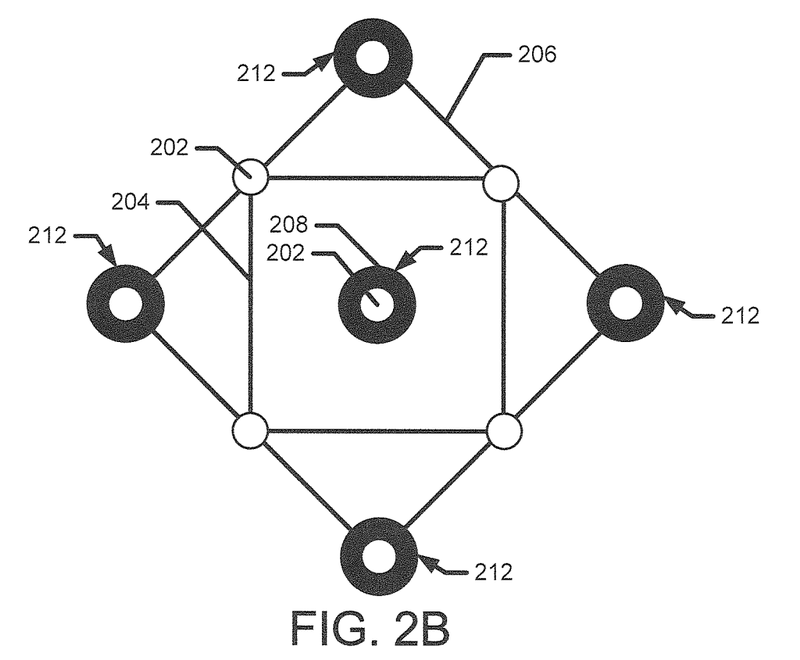
FIG. 2B illustrates an interface produced using coincident site lattice-matching epitaxial growth with a 45° rotation of the semiconductor lattice.

FIG. 2B illustrates an example of the same material 208 deposited on the same substrate 202 using coincident site lattice-matching epitaxy. In this example, the two materials exhibit a significant degree of lattice-matching when the lattice of the deposited material 208 is rotated by 45° relative to the lattice of the substrate material 202. Here, five points of the lattices are aligned at 212a-212e. Because the ratio of the deposited material's lattice constant 206 to the substrate's lattice constant 204 is equal to the square root of 2, a high degree of matching is possible with the 45° lattice rotation.

For the (001) orientation shown, the lattice of the deposited material may be rotated by any angle ranging from 0° to about 45°, depending on the ratio of the lattice constant of the substrate to the lattice constant of the deposited material. The rotation angle of the deposited material's lattice relative to the substrate lattice may be selected to minimize the lattice mismatch between the deposited material and the substrate. Typically, a coincident site lattice mismatch below about 0.5% may result in a deposited layer that is relatively free of defects caused by lattice mismatching.

Further, different crystal planes of the substrate may be used as the crystalline surface for deposition of material by coincident site lattice-matching epitaxy. For example, if the substrate has a face-centered cubic lattice structure, different crystal planes of the substrate, including but not limited to the {001}, {110}, and {111} crystal planes may be used as the substrate surface. The spacing between adjacent atoms in a particular crystal plane of the substrate may result in a better degree of lattice-matching with the lattice of the deposited material.

Figure 3:
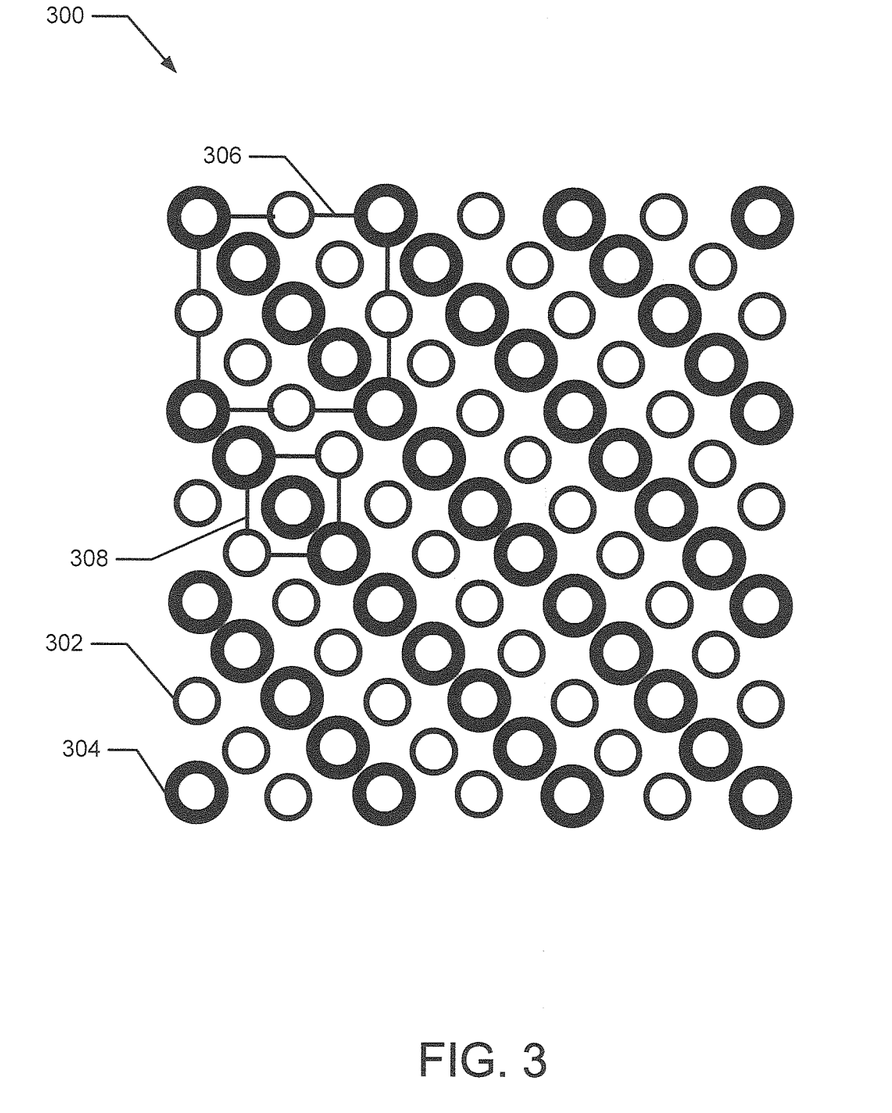
FIG. 3 is a schematic illustration of coincident site lattice-matching epitaxy at the {001} interface between the Al atoms of an fcc lattice based $MgAl_2O_4$ spinel substrate and a fcc Al buffer layer in which the lattice constant of the buffer layer is ½ of the lattice constant of the substrate.

FIG. 3 illustrates an example of the coincident site lattice-matching of a $MgAl_2O_4$ spinel substrate 304 having a lattice constant 306 that is about twice the lattice constant 308 of the deposited Al material 302 by virtue of a scaled lattice-match. In this example, because every other Al atom 302 in the deposited material lattice is matched to a substrate Al atom 304, the material may be deposited on the substrate with relatively low levels of internal stress, resulting in a crystalline deposit with relatively few defects.

b. Spinel Substrate

A spinel substrate that includes a crystalline surface is provided in one aspect of the present disclosure. Spinel, as commonly defined, is a cubic crystalline material with the formulation $MgAl_2O_4$. However, spinel is a member of a class of minerals, defined herein as the spinels, with the general formulation $A^{2+}B_2^{3+}O_4^{2-}$. In this more general formulation, A and B may be divalent, trivalent, or quadrivalent cations, including magnesium, zinc, iron, manganese, aluminum, chromium, titanium, and silicon. Non-limiting examples of spinels suitable for use as substrates in aspects of the method include $MgAl_2O_4$, $ZnAl_2O_4$, $FeAl_2O_4$, $CoFe_2O_4$, $FeMn_2O_4$, $MnFe_2O_4$, $Mn_3O_4$, $ZnFe_2O_4$, $ZnMn_2O_4$, $Fe_3O_4$, $NiFe_2O_4$, $TiFe_2O_4$, $FeCr_2O_4$, $MgCr_2O_4$, $MnAl_2O_4$, $CoAl_2O_4$, $NiAl_2O_4$, $CuCo_2S_4$ $Mg_2SiO_4$, $Fe_2TiO_4$, and $Fe_2SiO_4$.

In one particular aspect, the spinel substrate $MgAl_2O_4$ is provided for the deposition of the sacrificial buffer layer. This form of spinel is especially suitable because the lattice constant of $MgAl_2O_4$ is about 8.08 Å which is almost exactly twice the lattice constant of crystalline aluminum, which is about 4.05 Å. This proportion of lattice constants facilitates the deposition of aluminum, one particular example of a material for the sacrificial buffer layer, onto the spinet substrate using coincident site lattice-matching epitaxy as discussed above and illustrated in FIG. 3.

In addition to having a lattice constant that is well-suited for coincident site lattice-matching epitaxy, spinet is also a tough and durable material. Spinel is relatively inert to exposure to reagents such as hydrofluoric acid used in epitaxial liftoff techniques. Further, spinel may be translucent, allowing light pulses to be transmitted through the substrate in order to facilitate the degradation of the sacrificial substrate layer in epitaxial liftoff techniques.

The spinet substrate may be reused for the production of subsequent semiconductors because of the durability of the spinet material. After use, the spinel substrate may be cleaned of residual deposited sacrificial buffer layer using suitable techniques including but not limited to acid etching. Once cleaned, the spinel substrate may be reused as is, or the surface of spinel substrate may be further conditioned using suitable techniques including but not limited to etching and polishing and thermal annealing.

c. Growth of Sacrificial Buffer Layer

A sacrificial buffer layer may be grown on the crystalline surface of the spinet substrate in an aspect of the method. The sacrificial buffer layer may be grown using any suitable method of epitaxy including but not limited to vapor-phase epitaxy (VPE), liquid-phase epitaxy (LPE), molecular beam epitaxy (MBE), and metal organic chemical vapor deposition (MOCVD).

The sacrificial buffer layer is composed of a crystalline material that possesses at least one of several material properties. The lattice constant of the sacrificial buffer layer may be selected to be compatible with the lattice constant of the substrate material for either lattice-matching epitaxy or coincident site lattice-matching epitaxy. Further, the lattice constant of the sacrificial buffer layer may be selected to be lattice-matched with the lattice of the III-V semiconductors that are deposited onto the sacrificial buffer layer using either lattice-matching epitaxy or coincident site lattice-matching epitaxy. The material of the sacrificial buffer layer may further be a malleable metal material including but not limited to aluminum, in order to elastically absorb any internal stresses created within the deposited III-V semiconductor material during the deposition process.

In addition, the sacrificial buffer layer may be selected to be compatible with suitable epitaxial liftoff techniques including but not limited to chemical etching and melting. The material may be reactive with chemical reagents such as hydrofluoric acid so that the sacrificial buffer layer may be dissolved by the acid while leaving the deposited semiconductor and substrate intact in order to separate the III-V semiconductor layer from the substrate.

Non-limiting examples of suitable materials for the sacrificial buffer layer include fcc metals such as Al, Ag, Au, Pd, Pt and their alloys; III-V semiconductor materials; III-V semiconductor alloys; II-VI semiconductor materials; and II-VI semiconductor alloys. Specific non-limiting examples of suitable materials for the sacrificial buffer layer include Al, Ag, Au, Pd, Pt, AlN, BN, GaN, InN, AlAs, GaAs, GaInP, InAlAs, InGaAs, InGaN, AlGaAs, and AlGaN. If a semiconductor material is used as the sacrificial buffer layer, the material may be dissolved by a chemical reagent during the epitaxial liftoff.

The sacrificial buffer layer may be grown on the crystalline surface by any suitable technique of epitaxial growth. Non-limiting examples of techniques suitable for epitaxial growth include vapor-phase epitaxy (VPE), liquid-phase epitaxy (LPE), molecular beam epitaxy (MBE), and metal organic chemical vapor deposition (MOCVD). Depending on the particular technique used for epitaxial growth, the deposition of the sacrificial buffer layer may take place at a deposition temperature ranging from about room temperature to about 700° C. and higher.

The materials formed during the production of the device may be exposed to a wide range of temperatures during deposition and cooling. During the process, differential thermal expansion and contraction of the substrate and deposited III-V semiconductor material may introduce defect-causing internal thermal stresses to the materials. In order to reduce these thermal stresses, the material of the sacrificial buffer layer may be chosen to be ductile or compliant to reduce the differential swelling and shrinking during fabrication of the device. In one particular example, the buffer layer material may be chosen to be Al deposited by the technique of molecular beam epitaxy.

d. Growth of Semiconductor Material

A crystalline semiconductor material may be grown on the sacrificial buffer layer to form a device layer in an aspect of the method. The semiconductor material may be deposited using any of the epitaxy techniques described previously. In one particular aspect, the III-V semiconductor material is deposited using molecular beam epitaxy.

Depending on the material of the sacrificial buffer layer, the semiconductor material may be lattice-matched or coincident site lattice-matched to the buffer layer. For example, if a III-V semiconductor material is used for the sacrificial buffer layer, a device layer composed of another III-V semiconductor material may be lattice-matched to the sacrificial layer, since both materials are III-V semiconductor materials. Alternatively, if a ductile crystalline metal such as Al is used for the sacrificial buffer layer, a device layer composed of a III-V semiconductor may be coincident site lattice-matched using a 45° lattice rotation as described above in FIG. 2B, and other rotations.

The crystalline semiconductor material of the device layer may be selected based on the desired optoelectronic properties, including but not limited to band gap and electron mobility. The crystalline semiconductor material may be chosen from materials including but not limited to III-V semiconductor materials, III-V semiconductor alloys, II-VI semiconductor materials, and II-VI semiconductor alloys. Non-limiting examples of III-V semiconductor materials include AlSb, AlAs, AlN, AlP, BN, BP, BAs, $B_{12}As_2$, GaSb, GaAs, GaN, GaP, InSb, InAs, InN, and InP. Non-limiting examples of III-V semiconductor alloys include AlGaAs, InGaAs, InGaP, AlInAs, AlInSb, GaAsN, GaAsP, GaAsSb, AlGaN, AlGaP, InGaN, InAsSb, InGaSb, AlGaInAs, AlGaInP, AlGaAsP, InGaAsP, InGaAsSb, InPAsSb, AlInAsP, AlGaAsN, InGaAsN, InAlAsN, GaAsSbN, GaInNAsSb, and GaInAsSbP. Non-limiting examples of II-VI semiconductor materials include CdSe, CdS, CdTe, ZnO, ZnSe, ZnS, and ZnTe. Non-limiting examples of II-VI semiconductor alloys include CdZnTe, HgCdTe, HgZnTe, and HgZnSe. As used herein, a III-V semiconductor material refers to a crystalline semiconductor material that includes one element from the Group III elements (B, Al, Ga, In, and Tl) and one element from the Group V elements (N, P, As, Sb, and Bi); a III-V semiconductor alloy refers to a crystalline semiconductor material that includes at least three elements from the Group III elements and the Group V elements, including at least one element from each of the two groups. As used herein, a II-VI semiconductor material refers to a crystalline semiconductor material that includes one Group II element (Zn, Cd, and Hg) and one Group VI element (O, S, Se, Te, and Po); a II-VI semiconductor alloy refers to a crystalline semiconductor material containing at least three elements from the Group II and Group VI elements, including at least one element from each of the two groups. As used herein, a group IV semiconductor alloy refers to a crystalline semiconductor material that includes at least two Group IV elements (C, Si, Ge, Sn, and Pb).

At least one additional crystalline semiconductor material layers may be deposited onto the first semiconductor material layer of the device structure to produce the device. The additional crystalline semiconductor layer or layers may be chosen from any of the semiconductor materials described above, including but not limited to III-V semiconductor materials, III-V semiconductor alloys, II-VI semiconductor materials, and II-VI semiconductor alloys. The additional crystalline semiconductor material is typically lattice-matched to the first crystalline semiconductor material layer of the device structure, but the additional crystalline semiconductor material may be coincident site lattice-matched, depending upon the particular choice of semiconductor materials.

The arrangement and number of semiconductor materials in the device structure may be determined based on the function of the particular device that is fabricated using this method. Specific examples of the arrangement of semiconductor materials in several devices are provided below.

e. Separation of the Device Layer from the Substrate

Once the desired layers of crystalline semiconductor material of the device structure have been formed on the sacrificial buffer layer, the device structure may be separated from the crystalline spinel substrate surface using an epitaxial liftoff method. Any suitable epitaxial liftoff method may be used, including but not limited to chemical etching of the crystalline buffer material, melting of the buffer material, and combinations thereof. For example, an aluminum sacrificial layer may be etched away from the spinel substrate using a strong acid, such as HF, in order to produce the semiconductor device.

Before or after separation from the substrate, the device structure may be bonded or transferred to a suitable handle material to complete the fabrication of the semiconductor device. As used herein, a handle material refers to any material that is attached to a deposited layer of semiconductor materials on the surface opposite to the substrate that may be used to lift the semiconductor material off of the substrate after the sacrificial buffer layer has been removed by chemical etching or melting. The handle material may further act as a support for the layer of semiconductor material during subsequent use and may be attached to the semiconductor material using any suitable adhesive including but not limited to UV-activated adhesive, and heat-releasable adhesive. Any suitable handle material may be used, and may be selected to enhance at least one performance aspects of the device including but not limited to low weight, flexibility, electrical properties, and thermal management.

II. Semiconductor Devices

Figure 4:
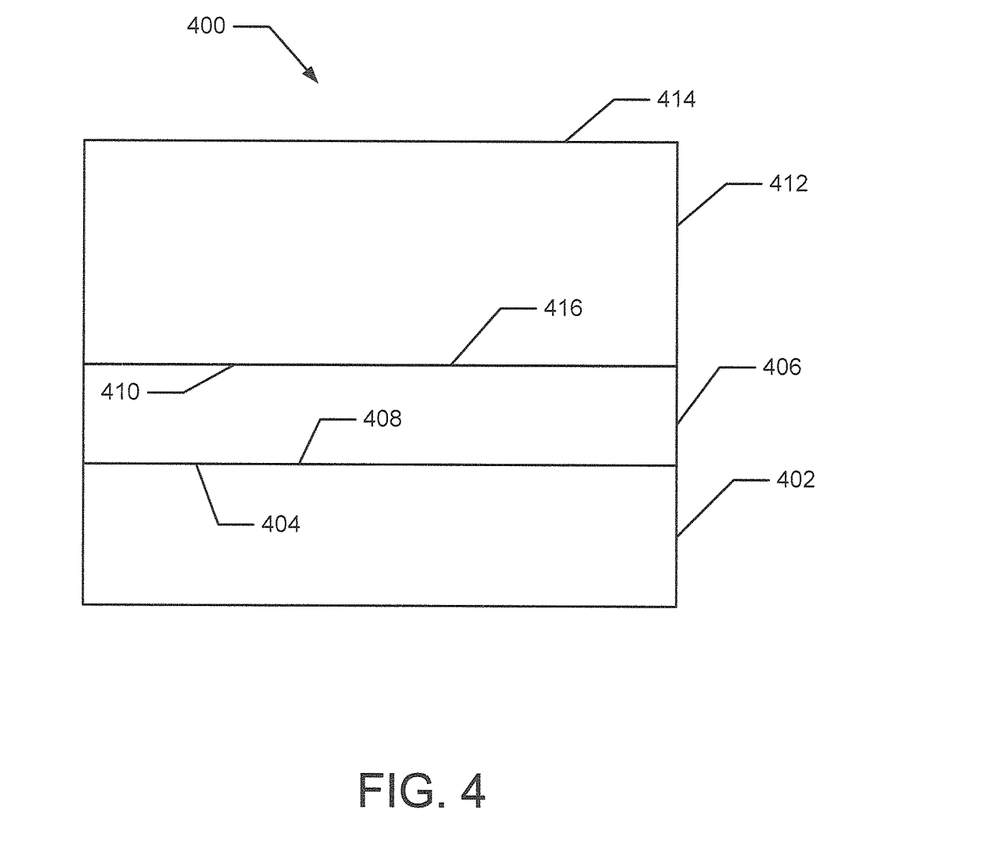
FIG. 4 is a schematic diagram of the layers of a semiconductor grown on a spinel substrate using a sacrificial buffer layer.

FIG. 4 is a schematic diagram illustrating the general arrangement of materials in a semiconductor device 400 prior to the release of the device 400 from the substrate. The device 400 includes spinel substrate 402 made of a spinel material as described above and also includes a crystalline spinel surface 404. The device further includes a sacrificial buffer layer 406 made of a crystalline buffer material, also described above; the sacrificial buffer layer also includes an upper buffer surface 410 and a lower buffer surface 408. The lower buffer surface 408 is coincident site lattice-matched to the crystalline spinel surface 404.

The device 400 also includes a first device layer 412 made of a first crystalline semiconductor material, and further includes a first device layer upper surface 414 and a first device layer lower surface 416. The first device layer lower surface 416 is lattice-matched or coincident site lattice-matched to the upper surface 410 of the sacrificial buffer layer 406.

Additional layers of crystalline semiconductor material may be deposited onto the first device layer upper surface 414 in order to produce semiconductor devices with the desired function. Non-limiting examples of semiconductor devices that may be formed using the methods described herein include photovoltaic solar cells, LEDs, lasers, transistors, and light detectors. Specific examples of semiconductor devices that may be fabricated using the method described herein are described below.

a. Light Emitting Diode/Solid-State Laser

A single layer and multiple layers of crystalline semiconductor material may be fabricated using the method described herein to be used as a light emitting diode (LED) or a solid state laser. The LEDs produced using this method may be high efficiency and high performance due to the relatively low incidence of defects in the semiconductor materials. Table 1 below summarizes common materials that may be formed using the method described herein for use in an LED or laser:

TABLE 1

Semiconductor Materials for LEDs

| Color | Wavelength | Semiconductor |
|---|---|---|
| Infra-red | $\lambda > 760$ | Gallium arsenide (GaAs) |
| | | Aluminum gallium arsenide (AlGaAs) |
| | | Indium gallium arsenide (InGaAs) |

TABLE 1-continued

Semiconductor Materials for LEDs

| Color | Wavelength | Semiconductor |
|---|---|---|
| Red | $610 < \lambda < 760$ | Aluminum gallium arsenide (AlGaAs) |
| | | Gallium arsenide phosphide (GaAsP) |
| Orange | $590 < \lambda < 610$ | Gallium arsenide phosphide (GaAsP) |
| | | Aluminum gallium indium phosphide (AlGaInP) |
| | | Gallium phosphide (GaP) |
| Yellow | $570 < \lambda < 590$ | Gallium arsenide phosphide (GaAsP) |
| | | Aluminum gallium indium phosphide (AlGaInP) |
| | | Gallium phosphide (GaP) |
| Green | $500 < \lambda < 570$ | Indium gallium nitride (InGaN)/ Gallium(III) nitride (GaN) |
| | | Gallium phosphide (GaP) |
| | | Aluminum gallium indium phosphide (AlGaInP) |
| | | Aluminum gallium phosphide (AlGaP) |
| Blue | $450 < \lambda < 500$ | Zinc selenide (ZnSe) |
| | | Indium gallium nitride (InGaN) |
| Violet | $400 < \lambda < 450$ | Indium gallium nitride (InGaN) |
| Ultra-violet | $\lambda < 400$ | Boron nitride (215 nm) |
| | | Aluminum nitride (AlN) (210 nm) |
| | | Aluminum gallium nitride (AlGaN) |
| | | Aluminum gallium indium nitride (AlGaInN) | b. Solar Cells/Light Detectors

Figure 5:
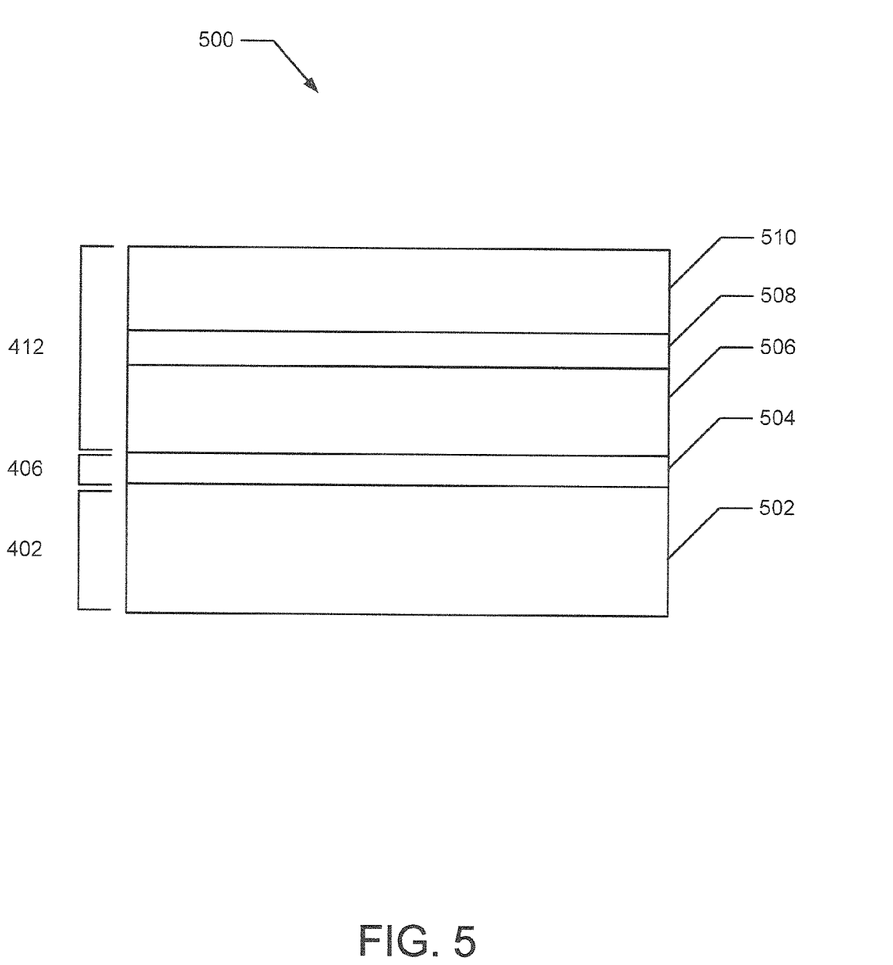
FIG. 5 is a schematic diagram of the layers of a two-junction solar cell grown on a spinel substrate using a sacrificial buffer layer.

Multiple layers of semiconductors may be fabricated using the methods described herein to form a solar cell or light detector. FIG. 5 illustrates an example of a two-junction solar cell 500 that may be fabricated using the method described herein. The two-junction solar cell 500 may include a spinel substrate 502, a sacrificial buffer layer 504, a GaInAlP high band gap (i.e. ~1.7-1.9 eV) junction 506, a tunnel junction 508, and a second lower band gap InGaAs (i.e. ~1.15 eV) junction 510. The GaInAlP layer 506 may be formed as a first device layer 412 onto the sacrificial buffer layer 406 as shown in FIG. 4 and separated from the substrate 402 as described previously.

EXAMPLES

The following examples illustrate various aspects of the present disclosure.

Example 1

Deposition of Aluminum on Spinel Substrate

To demonstrate the feasibility of depositing aluminum on a spinel substrate using the methods describes herein, the following experiments were conducted.

Figure 6:
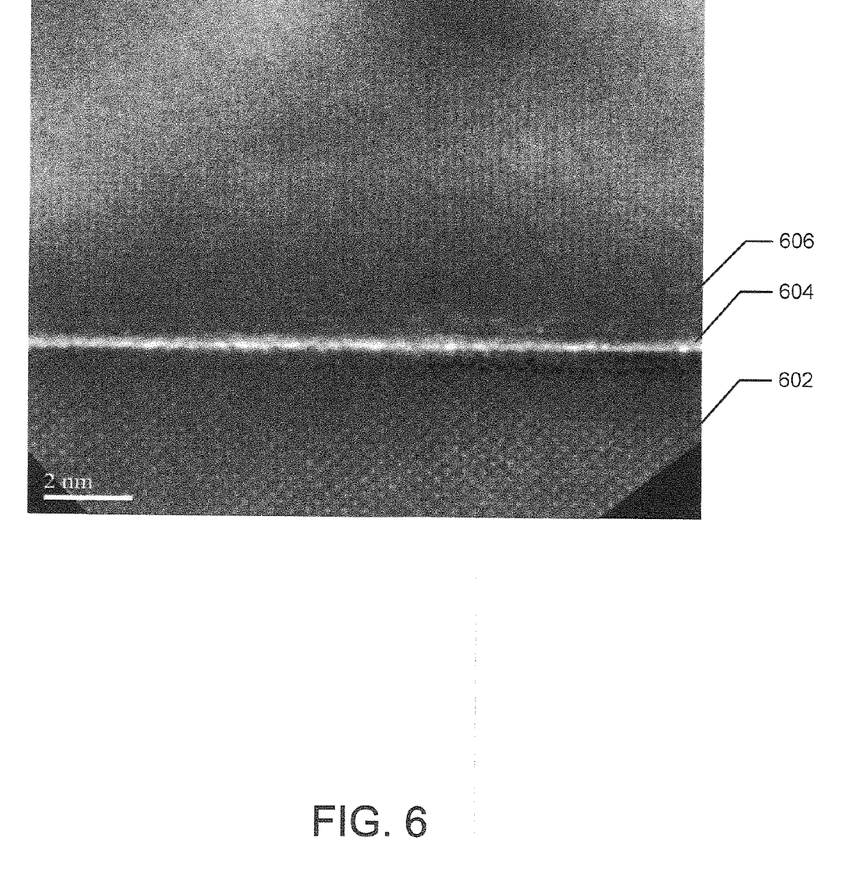
FIG. 6 is a high-resolution transmission electron microscopy image of an Al buffer layer grown on an (001) spinel substrate using coincident site lattice-matching epitaxial growth.

A single crystal of aluminum was deposited on a spinel ($MgAl_2O_4$) substrate using molecular beam epitaxy using coincident site lattice-matching epitaxial growth. A high-resolution transmission electron microscopy image of the Al buffer layer 606 grown on the spinel substrate 602 is shown in FIG. 6. The aluminum 606 and spinel 602 showed very few defects with a very uniform and defect free interface 604.

Example 2

Deposition of InGaAs on Spinel Substrate

To demonstrate the feasibility of depositing InGaAs on a spinel substrate using the methods describes herein, the following experiments were conducted.

Figure 7A:
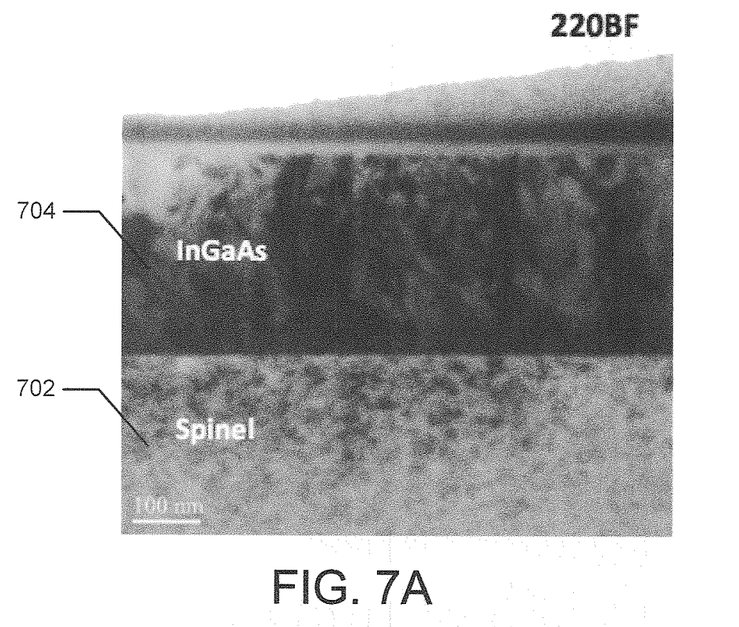
FIG. 7A is a bright field transmission electron microscopy image of an InGaAs buffer layer grown on a spinel substrate using coincident site lattice-matching epitaxial growth.
Figure 7B:
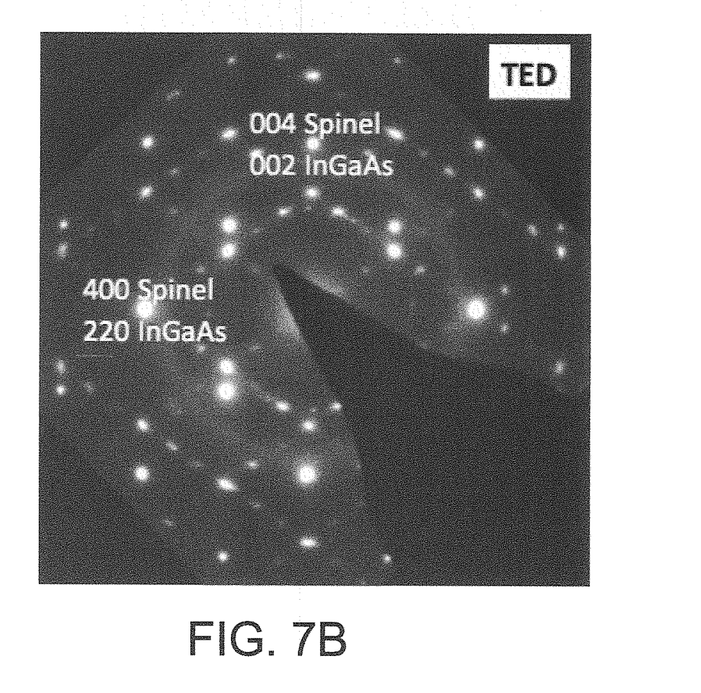
FIG. 7B is a corresponding transmission electron diffraction pattern obtained from the interface of the InGaAs buffer layer and the spinel substrate.

A single crystal of InGaAs 704 was deposited on a spinel ($MgAl_2O_4$) substrate 702 using molecular beam epitaxy at about 580° C. using coincident site lattice-matching epitaxial growth. A bright field transmission electron microscopy image of the InGaAs buffer layer grown on the spinel substrate is shown in FIG. 7A. The InGaAs and spinel showed very few defects with a very uniform and defect free interface 706. A transmission electron diffraction pattern of the spinel-InGaAs interface, shown in FIG. 7B further demonstrated that the InGaAs layer was crystalline and epitaxial, although it contained twinning.

Example 3

Liftoff of InGaAs from Aluminum Buffer Layer

To demonstrate the feasibility of depositing InGaAs on an aluminum buffer layer on a spinel substrate, and subsequently lifting off the InGaAs layer, the following experiments were conducted.

Figure 8:
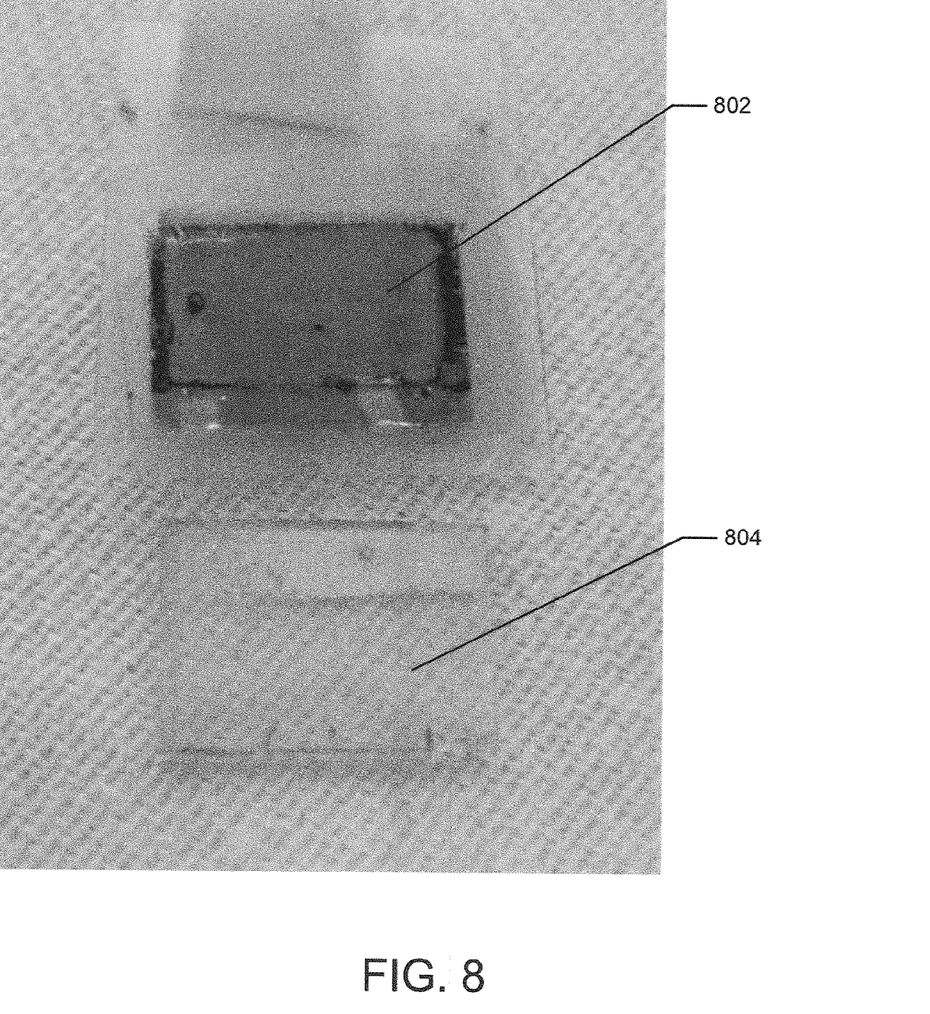
FIG. 8 is a photograph of a III-V semiconductor epilayer that was separated from a spinel substrate using acid etching of a sacrificial aluminum buffer layer.

An aluminum buffer layer was grown on a spinel substrate using methods similar to those described in Example 1. A layer of InGaAs was deposited onto the aluminum buffer layer using molecular beam epitaxy to a thickness of approximately 1 μm. The InGaAs layer was released from the spinel substrate by etching away the Al buffer layer using 20% HF in $H_2O$ overnight. The separated InGaAs film appeared to be free of any major defects, as shown in FIG. 8.

Measurements of the spinel substrate surface using reflection high-energy diffraction (RHEED) indicated that the substrate surface remained of a quality sufficient for reuse in subsequent epitaxial processes, even without further processing such as polishing or etching.

Example 4

Effect of Temperature of Quality of Aluminum Buffer Layer on Spinel

To assess the effect of process temperature on the quality of an aluminum buffer layer deposited on a spinel substrate, the following experiments were conducted. Aluminum buffer layers were formed on spinel substrates using methods similar to those described in Example 1. In these experiments, the aluminum buffer layers were formed at three different temperatures: room temperature, 300° C., and 450° C.

Figure 9:
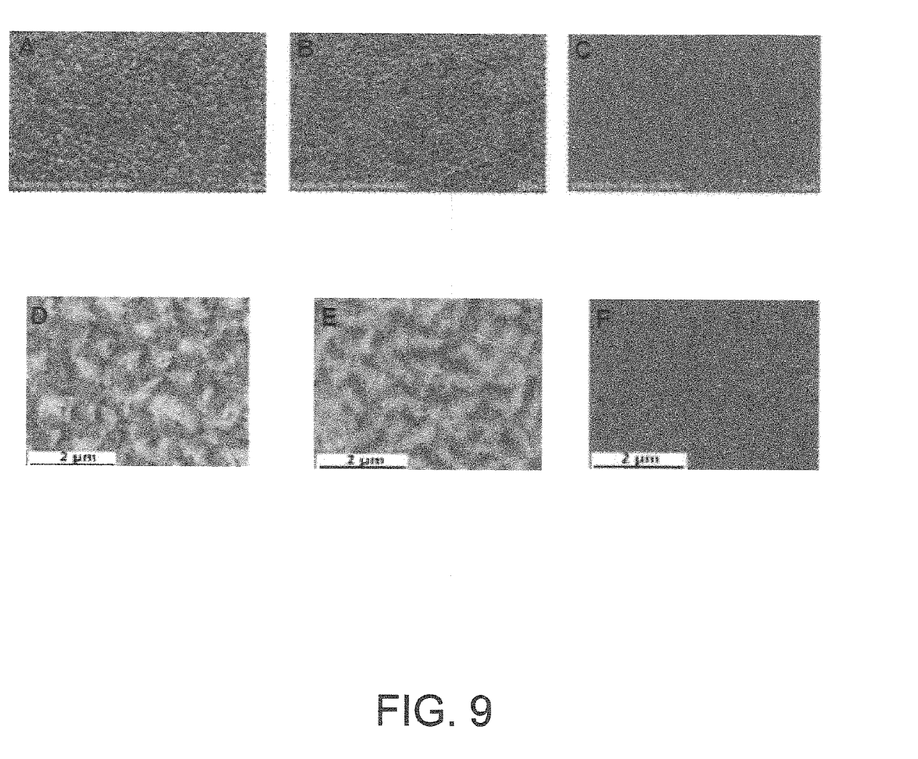
FIGS. 9A-9C are scanning electron microscopy images of the surface of aluminum crystals produced using coincident site lattice-matching epitaxial growth on a (001) spinel substrate at temperatures of 450° C.
FIGS. 9D-9F are electron backscattered diffraction orientation maps obtained for the crystals shown in FIGS. 9A-9C respectively.

FIG. 9 includes scanning electron microscopy images and electron backscattered diffractionorientation maps for the aluminum buffer layers formed at the three temperatures. FIG. 9A and FIG. 9D are the scanning electron microscopy image and electron backscattered diffraction orientation map, respectively, of the Al buffer layer formed at 450° C. FIG. 9B and FIG. 9E are similar images of the Al buffer layer formed at 300° C., and FIG. 9C and FIG. 9F are similar images of the Al buffer layer formed at room temperature. Comparing the images, the aluminum buffer layer formed at room temperature was a uniform single crystal with very few defects, while the aluminum buffer layers formed at the higher temperatures exhibited a multi-crystalline structure with more irregular structure as temperature increased.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A method of producing a semiconductor device comprising:
   growing a crystalline buffer material on a crystalline surface of a spinel substrate comprising $MgAl_2O_4$ by coincident site lattice-matching epitaxy to form a sacrificial buffer layer, wherein the crystalline buffer material comprises Al;
   growing a first crystalline semiconductor material on the sacrificial buffer layer by lattice-matching epitaxy or coincident site lattice-matching epitaxy to form a first device layer comprising at least one of a III-V semiconductor material, a III-V semiconductor alloy, a II-VI semiconductor material, a II-VI semiconductor alloy, or mixtures thereof on the sacrificial buffer layer; and
   separating the first device layer from the crystalline spinel substrate surface using an epitaxial liftoff method chosen from chemical etching of the crystalline buffer material or melting of the buffer material to produce a semiconductor device comprising the first device layer.

2. The method of claim 1, wherein at least one additional crystalline semiconductor material is grown on the first crystalline semiconductor material by lattice-matching epitaxy prior to separating the first device layer from the crystalline spinel substrate surface, the semiconductor device comprising the first device layer and the at least one additional crystalline semiconductor material.

3. The method of claim 1, wherein the coincident site lattice-matching epitaxy and the lattice-matching epitaxy processes are conducted using molecular beam epitaxy.

4. The method of claim 1 or claim 2, wherein the semiconductor device is chosen from a photovoltaic solar cell, an LED, a laser, a transistor, or a light detector.

5. The method of claim 1, further comprising recycling the spinel substrate for producing additional semiconductor devices.

6. A semiconductor device comprising:
   a crystalline spinel substrate comprising $MgAl_2O_4$;
   a sacrificial buffer layer comprising crystalline Al, wherein the sacrificial buffer layer is coincident site lattice-matched to the crystalline spinel substrate; and
   a first device layer comprising a first crystalline semiconductor material chosen from at least one of a III-V semiconductor material, a III-V semiconductor alloy, a II-VI semiconductor material, or a II-VI semiconductor alloy, wherein the first device layer is coincident site lattice-matched to the sacrificial buffer layer.

7. The device of claim 6, further comprising at least one additional device layer comprising at least one additional crystalline semiconductor material chosen from at least one of III-V a semiconductor material, a III-V semiconductor alloy, a II-VI semiconductor material, or a II-VI semiconductor alloy, wherein the at least one additional device layer is lattice-matched to the first device layer.

8. The method of claim 7, wherein the semiconductor device is a two junction PV solar cell, the first crystalline semiconductor material comprises GaInAlP alloy having a band gap of about 1.7-1.9 eV, and the at least one additional semiconductor material comprises InGaAs alloy having a band gap of about 1.15 eV.

9. The device of claim 6 or claim 7, wherein the semiconductor device is chosen from a photovoltaic solar cell, an LED, a laser, a transistor, or a light detector.

10. The method of claim 6, wherein the semiconductor device is an LED and the first crystalline semiconductor material comprises InGaN having a band gap ranging between about 1.9 eV and about 2.5 eV.

* * * * *